(12) United States Patent
Sakata

(10) Patent No.: US 6,282,691 B1
(45) Date of Patent: Aug. 28, 2001

(54) CRC CODING SYSTEM AND CRC CODING METHOD

(75) Inventor: Masayuki Sakata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/166,216

(22) Filed: Oct. 5, 1998

(30) Foreign Application Priority Data

Oct. 3, 1997 (JP) .................................................. 9-270686

(51) Int. Cl.[7] .......................... H03M 13/15; H03M 13/29
(52) U.S. Cl. ............................................................. 714/807
(58) Field of Search ..................................................... 714/807

(56) References Cited

U.S. PATENT DOCUMENTS 3,678,469 * 7/1972 Freeman et al. ................. 340/172.5
4,156,796 * 5/1979 O'Neal et al. ............................ 178/3

FOREIGN PATENT DOCUMENTS

| 6-70032 | 9/1994 | (JP) . |
| 8-115230 | 5/1996 | (JP) . |
| 8-195736 | 7/1996 | (JP) . |

* cited by examiner

Primary Examiner—Stephen M. Baker
(74) Attorney, Agent, or Firm—Foley & Lardner

(57) ABSTRACT

A CRC coding system is provided. The coding system includes both a CRC-16 encoder and a CRC-CCITT encoder. In this system, information is input to one of the CRC-16 and CRC-CCITT encoder from the least significant bit. Information is also input to one of the CRC-16 and CRC-CCITT encoder from the most significant bit. Beneficially, the system allows for enhanced error detection in the case where the received data causes nominal bit shift.

20 Claims, 9 Drawing Sheets

TRANSMISSION SIDE

TRANSMISSION SIDE

RECEPTION SIDE

TRANSMISSION SIDE

RECEPTION SIDE

CRC CODING SYSTEM AND CRC CODING METHOD

BACKGROUND OF THE INVENTION

1. Field of the Invention

The present invention relates to a cyclical redundancy check (CRC) coding system for a mobile data communication. More particularly, the invention relates to a CRC coding system for a mobile communication system with enhanced error detecting performance.

2. Description of the Related Art

In a high speed data transmission system in a digital car telephone system, a CRC coding method is employed. The conventional CRC coding method has been set forth in RCR STD-27D as a standard specification of a digital car telephone system defined by Research & Development Center for Radio Systems, Japan.

The CRC coding method set forth in RCR STD-27D has two kinds of CRC, i.e. CRC-16 and CRC-CCITT. In both CRC coding methods, information is input to a CRC encoder taking a most significant bit (MSB) of the data as a leading bit for adding CRC code from the MSB.

FIGS. 9 and 10 show a construction for realizing the conventional CRC coding system. On a transmission side, data is input to a CRC-16 encoder 210 from the MSB to add CRC-16 code and then to output to a CRC-CCITT encoder 220. Then, transmission data is transmitted from the CRC-CCITT encoder 220 with adding CRC-CCITT code.

On a reception side, received data is input to the CRC-CCITT encoder 220 from the MSB. When all data are zero (0), judgment is made that there is no error. On the other hand, data eliminated CRC-CCITT code and CRC-16 code are input to the CRC-16 encoder 210. If all data in the CRC-16 encoder 210 are zero (0), judgment is made that there is no error. Then, data eliminated CRC-16 code is taken as a received data.

Hereinafter, discussion will be given for conventional way of calculation of CRC-16 code.

Conventional procedure of calculation of CRC-16 code.

Respective bits to be transmitted are taken in sequential order from the MSB to be $a_{191}, a_{190}, a_{189}, \ldots a_2, a_1, a_0$.

Respective bits derived by calculation are taken in sequential order from the MSB to be $b_{191}, b_{190}, b_{189}, \ldots b_2, b_1, b_0$.

Respective bits of the CRC-16 thus derived are taken in sequential order from the MSB to be $c_{15}, c_{14}, c_{13}, \ldots c_2, c_1, c_0$.

CRC-16 code can be derived through the following equation (1).

$$X^{16} \cdot P(X) = Q(X) \cdot G(X) + R(X) \quad (1)$$

$$P(X) = a_{191}X^{191} + a_{190}X^{190} \cdots + a_1X + a_0$$

$$Q(X) = b_{191}X^{191} + b_{190}X^{190} \cdots + b_1X + b_0$$

$$R(X) = c_{15}X^{15} + c_{14}X^{14} \cdots + c_1X + c_0$$

$$G(X) = X^{16} + X^{15} + X^2 + 1$$

where, P(X) is a polynominal expression derived from data to be transmitted, Q(X) is a polynominal expression of a solution, R(X) is a polynominal expression of CRC-16, and G(X) is a CRC-16 generating polynominal expression.

From this, c15 to c0 can be derived by deriving b191 to b0 in sequential order from the following equation (2). It should be noted that calculation of a191 to a0, b191 to b0 and c15 to c0 are all mod2 (0+0=1+1=0, 0+1=0−1=1).

$$b_{191} = a_{191} \quad (2)$$

$$b_{190} = a_{190} + b_{191}$$

$$b_{189} = a_{189} + b_{190}$$

$$b_{188} = a_{188} + b_{189}$$

$$\vdots$$

$$b_2 = a_2 + b_3 + b_{16} + b_{18}$$

$$b_1 = a_1 + b_2 + b_{15} + b_{17}$$

$$b_0 = a_0 + b_1 + b_{14} + b_{16}$$

$$c_{15} = b_0 + b_{13} + b_{15}$$

$$c_{14} = b_{12} + b_{14}$$

$$c_{13} = b_{11} + b_{13}$$

$$\vdots$$

$$c_2 = b_0 + b_2$$

$$c_1 = b_1$$

$$c_0 = b_0$$

Accordingly, respective bits to be transmitted are expressed on the basis of the MSB by the following equation (3).

$$a_{191}, a_{190}, a_{189}, \ldots a_2, a_1, a_0, c_{15}, c_{14}, c_{13}, \ldots, c_2, c_1, c_0 \quad (3)$$

where c15 to c0 are result of the foregoing calculation.

In general, upon reception of data, due to external disturbance or so forth in the transmission zone, it is possible to cause the leading bit to drop out, or addition of extra bit.

In such case, in the conventional CRC coding method, data is received in a condition where the data appears bit shifted from the original data to make that no error is judged upon checking of code error, high. The reason is that shift registers are employed as encoders in CRC-16 and CRC-CCITT.

As one example, the conventional calculation method of CRC-16 code when bit shift in data generated by the CRC-16 encoder by drop out of the leading bit on the reception side, will be discussed hereinafter.

Conventional Calculation of CRC-16 code upon Occurrence of Drop out of One bit

When the data transmitted through conventional CRC-16 calculation causes drop out of the first one bit, the reception data on the reception side lacks a191 and thus can be expressed by the following expression (4) on the basis of the MSB.

$$a_{190}, a_{189}, a_{188}, \ldots, a_1, a_0, c_{15}, c_{14}, c_{13}, c_{12}, \ldots, c_1, c_0, e_{15} \quad (4)$$

where e15 is the MSB of CRC-CCITT.

The foregoing expression (4) is then adapted to the equation for deriving CRC-16. It is assumed that solutions derived through calculation are b'191, b'190, b'189, . . . , b'2, b'1, b'0 in sequential order from the MSB, and respective bits of the CRC-16 code derived are c'15, c'14, c'13, . . . , c'2, c'1 in sequential order from the MSB. Thus, the following equation (5) is established.

$$R'(X) = X^{16} \cdot P'(X) - Q'(X) \cdot G(X) \quad (5)$$

$$P'(X) = a_{190}X^{191} + a_{189}X^{190} \cdots + a_0X + c_{15}$$

$$Q'(X) = b'_{191}X^{191} + b'_{189}X^{190} \cdots + b'_1X + b'_0$$

$$R'(X) = c'_{15}X^{15} + c'_{14}X^{14} \cdots + c'_1X + c'_0$$

$$G(X) = X^{16} + X^{15} + X^2 + 1$$

where P' (X) is a polynominal expression established from the received data, Q' (X) is a polynominal expression of the solutions, R' (X) is a polynominal expression of CRC-16 code, and G' (X) is a CRC-16 generating polynominal expression.

When the following expression (6) is satisfied, recognition is made on the reception side that data is correct.

$$c'_{15}=c_{14}, c'_{14}=c_{13}, c'_{13}=c_{12}, \ldots, c'_2=c_1, c'_1=c_0, c'_0=e_{15} \quad (6)$$

When calculation is performed and the result of the conventional CRC-16 calculation method is added, and considering that a191=0, a result as expressed by the following equation (7) can be obtained.

Here, it should be noted that the reason why it is assumed that a191=0 is given, is that the condition that a191=0 is an essential condition since distinct cases where a191 is added to respective bits of the solutions and respective bits of the CRC-16 code, and where a191 is not added to respective bits.

$$b'_{191} = a_{190} = b_{190} + b_{191} = b_{190} + a_{191} = b_{190} \quad (7)$$

$$b'_{190} = a_{189} + b'_{191} = (b_{189} + b_{190}) + b_{190} = b_{189}$$

$$b'_{189} = a_{188} + b'_{190} = (b_{188} + b_{189}) + b_{189} = b_{188}$$

$$b'_{188} = a_{187} + b'_{189} = (b_{187} + b_{188}) + b_{188} = b_{187}$$

$$\vdots$$

$$b'_2 = a_1 + b'_3 + b'_{16} + b'_{18}$$
$$= (b_1 + b_2 + b_{15} + b_{17}) + b_2 + b_{15} + b_{17} = b_1$$

$$b'_1 = a_0 + b'_2 + b'_{15} + b'_{17}$$
$$= (b_0 + b_1 + b_{14} + b_{16}) + b_1 + b_{14} + b_{16} = b_0$$

$$b'_0 = c_{15} + b'_1 + b'_{14} + b'_{16}$$
$$= (b_0 + b_{13} + b_{15}) + b_0 + b_{13} + b_{15} = 0$$

$$c'_{15} = b'_0 + b'_{13} + b'_{15} = b_{12} + b_{14} = c_{14}$$

$$c'_{14} = b'_{12} + b'_{14} = b_{11} + b_{13} = c_{13}$$

$$c'_{13} = b'_{11} + b'_{13} = b_{10} + b_{12} = c_{12}$$

$$\vdots$$

$$c'_2 = b'_0 + b'_2 = 0 + b_1 = c_1$$

$$c'_1 = b'_1 = b_0 = c_0$$

$$c'_0 = b'_0 = \phantom{0} = 0$$

Namely, in the case where a191 and e15 are zero, even when drop out of the leading one bit is caused, recognition that the data is correct can be made on the reception side.

Thus, in such a conventional CRC coding method, when a bit shift is caused in the reception data, error detection performance becomes low.

SUMMARY OF THE INVENTION

An object of the present invention is to provide a CRC coding system and a CRC coding method which can achieve high error detection performance even in the case a bit shift is caused in reception data without degrading error detection performance held in the conventional CRC coding system.

According to the first aspect of the present invention, there is provided a CRC coding method for performing coding by a CRC-16 encoder and a CRC-CCITT encoder, comprising:

inputting data to one of said CRC-16 encoder and said CRC-CCITT encoder in a sequential order from a least significant bit to a most significant bit, and inputting data to the other of said CRC-16 encoder and said CRC-CCITT encoder in sequential order from a most significant bit.

In the CRC coding method, on a transmission side of data, the transmission comprises:

sequence order reversing data input in a sequential order from the most significant bit to input data in a sequential order from the least significant bit to the CRC-16 encoder, sequence order reversing data from the CRC-16 encoder to input data in a sequential order from the most significant bit to the CRC-CCITT encoder, inputting a CRC-16 code generated by the CRC-16 encoder to said CRC-CCITT encoder without sequence order reversing, and outputting a CRC-CCITT code generated by the CRC-CCITT encoder to follow the data and the CRC-16 code, and wherein on a reception side of data, the reception comprises:

inputting received data to the CRC-CCITT encoder in a sequential order from the most significant bit, sequence order reversing data, from which a CRC-CCITT code has been eliminated, from the CRC-CCITT encoder and inputting said sequence order reversed data from said CRC-CCITT encoder to the CRC-16 encoder, inputting the CRC-16 code to said CRC-16 encoder without sequence order reversing, and outputting data from which said CRC-16 data has been eliminated from the CRC-16 encoder as reception data.

In the alternative, the CRC coding method, on a transmission side of data, the transmission comprises:

inputting data input in a sequential order from the most significant bit, to the CRC-16 encoder, sequence order reversing data and CRC-16 code generated from the CRC-16 encoder and inputting said sequence order reversed CRC-16 code and data to the CRC-CCITT encoder in a sequential order from the least significant bit, and outputting the data and the CRC-16 code from the CRC-CCITT sequence order reversed and outputting a CRC-CCITT code generated from said CRC-CCITT encoder following the data and the CRC-16 code without sequence order reversing, and wherein on a reception side of data, the reception comprises:

inputting received data to the CRC-CCITT encoder sequence order reversed and inputting the CRC-CCITT code to the CRC-CCITT encoder without sequence order reversing, inputting data from which the CRC-CCITT code has been eliminated from the CRC-CCITT encoder to the CRC-16 encoder and sequence order reversing data and CRC-16 code output from said CRC-16 encoder in a sequential order from the most significant bit, and outputting data from which the CRC-16 code has been eliminated from the CRC-16 encoder as reception data.

The CRC coding method may be applied to CRC coding of a high speed data transmission system of a digital car telephone system.

According to the second aspect of the present invention, there is provided a CRC coding method for performing coding by a CRC-16 encoder and a CRC-CCITT encoder, comprising:

inputting data to one of said CRC-16 encoder and said CRC-CCITT encoder in sequential order from a most significant bit, and generating and adding a CRC code by one of the CRC-16 encoder and the CRC-CCITT encoder in a sequential order from the least significant bit to the most significant bit.

In the CRC coding method, on a transmission side of data, the transmission comprises:

inputting data in a sequential order from the most significant bit to the CRC-16 encoder, sequence order reversing CRC-16 code generated by the CRC-16 encoder and following data from the CRC-16 encoder and inputting said sequence order reversed CRC-16 code and data to the CRC-CCITT encoder, generating a CRC-CCITT code by the CRC-CCITT encoder and transmitting said CRC-CCITT code following the data and the CRC-16 code, and wherein on a reception side of data, the reception comprises:

inputting data received in a sequential order from the most significant bit to the CRC-CCITT encoder, sequence order reversing CRC-16 code following data output from the CRC-CCITT encoder and inputting said sequence order reversed CRC-16 code and said data output from said CRC-CCITT encoder to the CRC-16 encoder, and outputting data from the CRC-16 encoder, from which the CRC-16 code is eliminated, as reception data.

In the alternative, in the CRC coding method, on a transmission side of data, the transmission comprises:

inputting data input in a sequential order from the most significant bit to the CRC-16 encoder, inputting data from the CRC-16 encoder and a CRC-16 code generated by the CRC-16 encoder to said CRC-CCITT encoder as is, sequence order reversing a CRC-CCITT code generated by the CRC-CCITT encoder following the data and the CRC-16 code, and wherein on a reception side of data, the reception comprises:

inputting received data to the CRC-CCITT encoder in a sequential order from the most significant bit and sequence order reversing the CRC-CCITT code, inputting data from which said CRC-CCITT code has been eliminated from the CRC-CCITT encoder and the CRC-16 code to the CRC-16 encoder, and outputting data from which said CRC-16 code has been eliminated from the CRC-16 encoder as reception data.

According to the third aspect of the present invention, a CRC coding system performing CRC coding comprises:

a CRC-16 encoder;

a CRC-CCITT encoder;

a sequence order reversing portion that inputs data to one of the CRC-16 encoder and the CRC-CCITT encoder in a sequential order from the least significant bit to the most significant bit; and another sequence order reversing portion that inputs data to the other of said CRC-16 encoder and said CRC-CCITT encoder in a sequential order from the most significant bit.

In the preferred construction, a transmission side circuit comprising:

a first sequence order reversing portion that sequence order reverses data input in a sequential order from the most significant bit and inputs said sequence order reversed data to the CRC-16 encoder in a sequential order from the least significant bit; and a second sequence order reversing portion that sequence order reverses data from the CRC-16 encoder and inputs said sequence order reversed data from said CRC-16 encoder to said CRC-CCITT encoder in a sequential order from the most significant bit, and a reception side circuit comprising:

a third sequence order reversing portion that sequence order reverses data from the CRC-CCITT encoder, and inputs to the CRC-16 encoder in a sequential order from the least significant bit; and fourth sequence order reversing portion that sequence order reverses data, from which CRC-16 code is eliminated, from the CRC-16 encoder.

In the alternative, a transmission side circuit comprising:

first sequence order reversing portion that sequence order reverses data and a CRC-16 code from the CRC-16 encoder, and inputs said sequence order reversed data to the CRC-CCITT encoder in a sequential order from the least significant bit; and second sequence order reversing portion that sequence order reverses the data and the CRC-16 code other than a CRC-CCITT code generated by the CRC-CCITT encoder, and a reception side circuit comprising:

third sequence order reversing portion that sequence order reverses received data other than the CRC-CCITT code; and fourth sequence order reversing portion that sequence order reverses data, from which CRC-CCITT code is eliminated, and said CRC-16 code from the CRC-CCITT encoder and inputs to the CRC-16 encoder in a sequential order from the most significant bit.

According to the fourth aspect of the present invention, a CRC coding system for CRC coding comprises:

a CRC-16 encoder;

a CRC-CCITT encoder;

a sequence order reversing portion that adds a CRC code generated by one of the CRC-16 encoder and the CRC-CCITT encoder in a sequential order from the least significant bit to the most significant bit; and another sequence order reversing portion that inputs data to one of said CRC-16 encoder and said CRC-CCITT encoder in a sequential order from the most significant bit.

In the preferred construction, a transmission side circuit comprising:

first sequence order reversing portion that sequence order reverses a CRC-16 code generated by the CRC-16 encoder following data and inputs to the CRC-CCITT encoder, a reception side circuit comprising:

second sequence order reversing portion that sequence order reverses the CRC-16 code following data, from which the CRC-CCITT code is eliminated, from the CRC-CCITT encoder, and inputs to the CRC-16 encoder.

In the alternative, a transmission side circuit comprising:

first sequence order reversing portion that sequence order reverses the CRC-CCITT code generated by the CRC-CCITT encoder, following the data and a CRC-16 code for outputting, and a reception side circuit comprising:

second sequence order reversing portion that sequence order reverses the CRC-CCITT code and inputs to the CRC-CCITT encoder.

According to the fifth aspect of the present invention, a computer readable memory storing a CRC coding program performing coding by a CRC-16 encoder and a CRC-CCITT encoder, wherein the CRC coding program performs a coding process, said coding process comprising:

inputting data to one of the CRC-16 encoder and the CRC-CCITT encoder in a sequential order from the least significant bit to the most significant bit, and inputting data to the other of said CRC-16 encoder and said CRC-CCITT encoder in sequential order from a most significant bit.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the present invention, which, however, should not be taken to limit to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessarily obscuring the present invention.

A CRC coding system in accordance with the present invention performs encoding utilizing both CRC-16 and CRC-CCITT. In calculation of CRC-16 and CRC-CCITT, sequential orders of inputting of information are differentiated in respective coding. More particularly, information is input to a CRC-16 encoder in a sequential order from a least significant bit (LSB) of data, i.e., data LSB first and information is input to a CRC-CCITT encoder in a sequential order from the MSB, i.e. data MSB first.

Thus, with maintaining sequential order of information input to the CRC-16 encoder and to the CRC-CCITT encoder, error detection performance can be enhanced in the case where a nominal bit shift occurs in the reception data.

Figure 1:
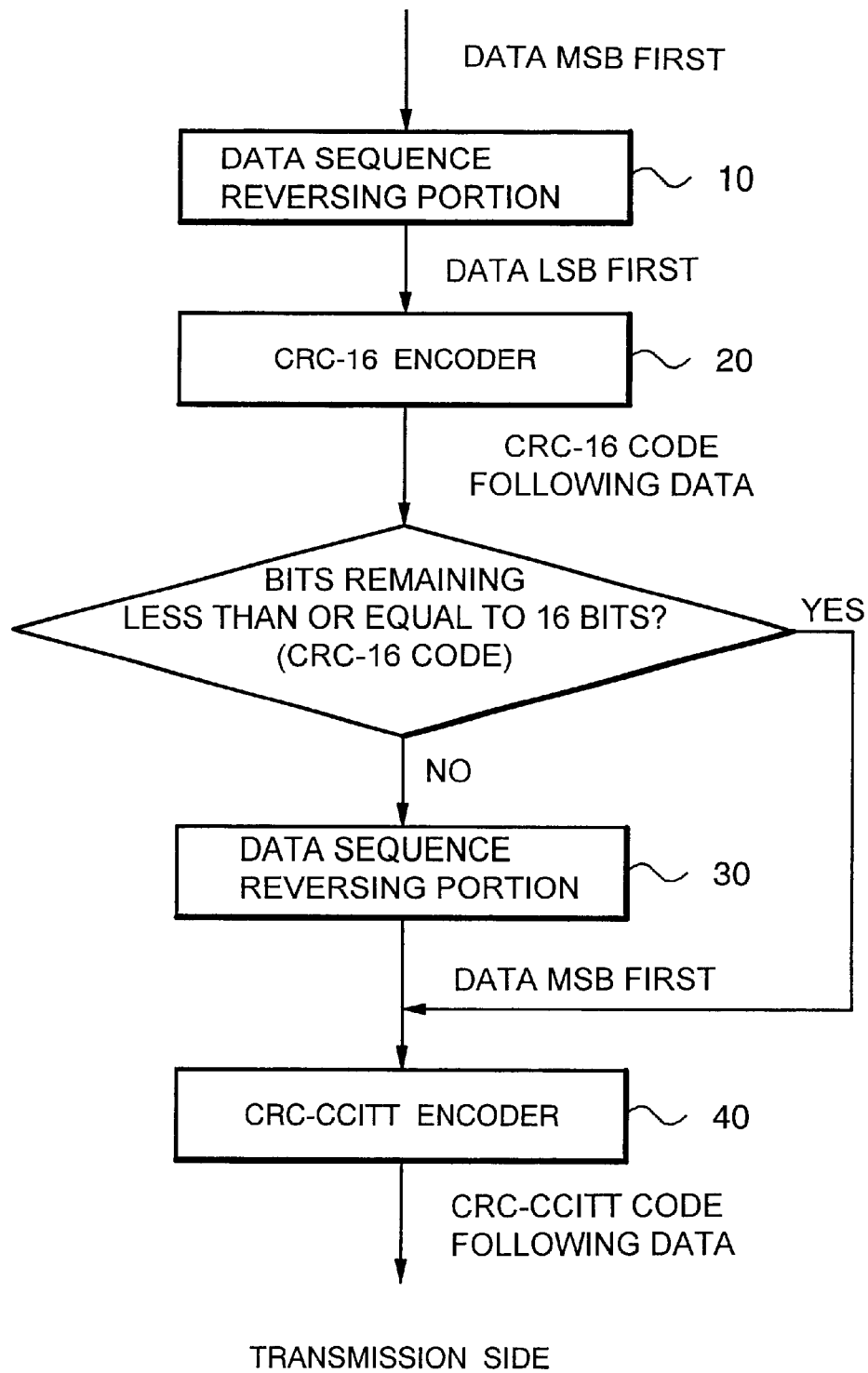
FIG. 1 is an illustration showing a construction on a transmission side in the first embodiment of a CRC coding system according to the present invention.
Figure 2:
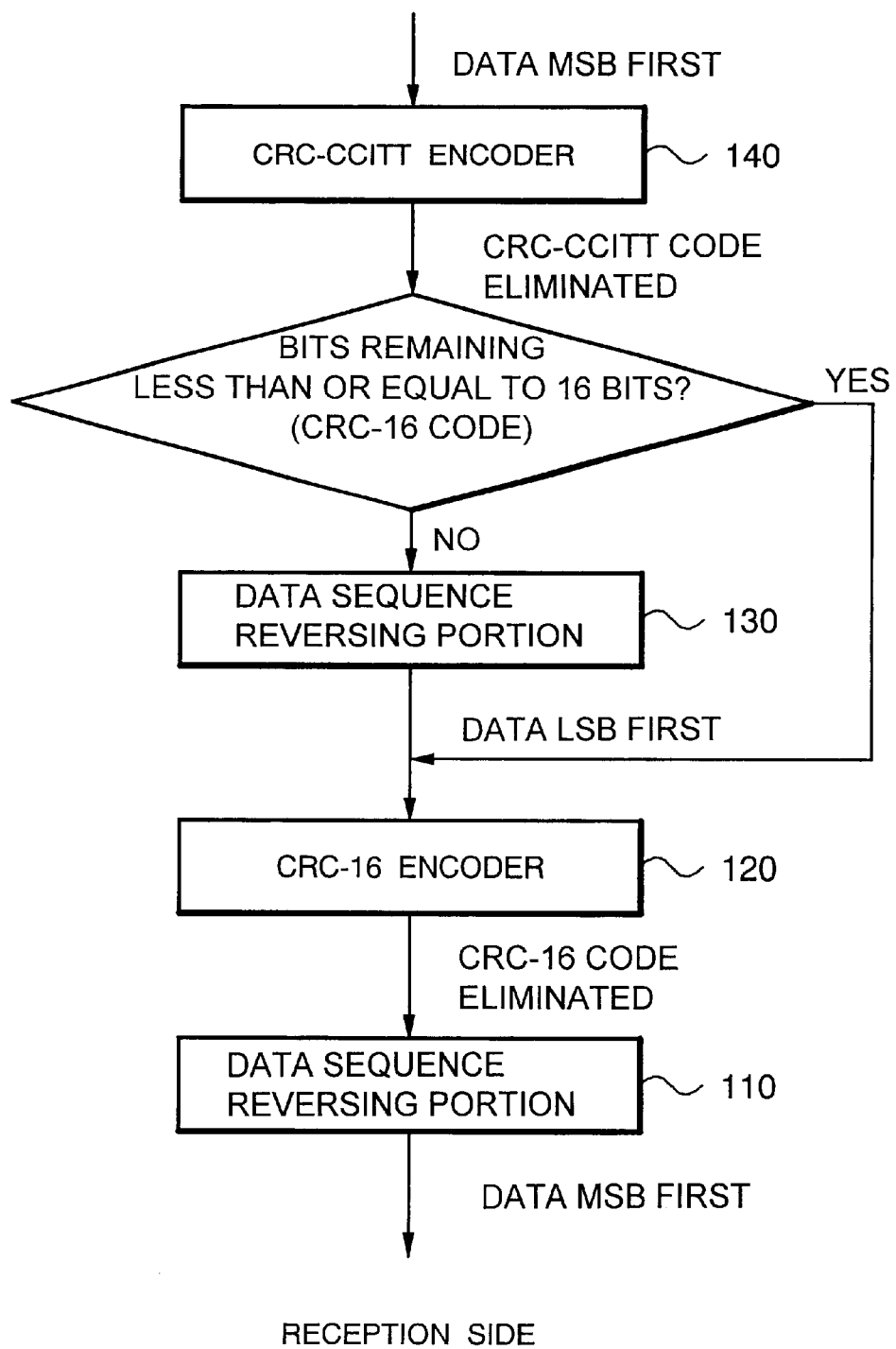
FIG. 2 is an illustration showing a construction on a reception side in the first embodiment of the CRC coding system according to the present invention.

Next, the first embodiment of the CRC coding system according to the present invention will be discussed in detail. FIG. 1 shows a construction on a transmission side of the first embodiment of the CRC coding system, and FIG. 2 shows a construction on a reception side. Here, respective components on the transmission side and the reception side are common. Therefore, by switching by means of an appropriate changeover switch, it becomes possible that a single construction may be selectively used on the transmission side and the reception side.

A transmission side circuit is constructed with a data sequence order reversing portion 10, a CRC-16 encoder 20, a data sequence order reversing portion 30 and a CRC-CCITT encoder 40.

The data sequence order reversing portion 10 reverses the sequence of a transmission data input in a sequential order from a leading data (MSB), i.e., data LSB first to output the input data to the CRC-16 encoder 20 in a sequential order from the trailing end data (LSB).

The CRC-16 encoder 20 derives a CRC-16 code from the transmission data input in a sequential order from the LSB, i.e., data LSB first to output the CRC-16 code following the transmission data in the sequential order from the LSB.

The transmission data output from the CRC-20 encoder 20 and ordered from the LSB, is sequence order reversed by the data sequence order reversing portion 30 outputting the input data from the trailing end.

Upon reaching the final sixteen bits which is CRC-16 code, the output of the data sequence order reversing portion 30 is input to the CRC-CCITT encoder 40. The final sixteen bits as the CRC-16 code is input to the CRC-CCITT encoder 40 in sequential order without passing the data sequence order reversing portion 30 with maintaining the sequential order as output from the CRC-16 encoder 20.

The CRC-CCITT encoder 40 derives the CRC-CCITT code from the transmission data and the CRC-16 code and transmits the CRC-CCITT code following the transmission data and the CRC-16 code.

A reception side circuit is constructed with a CRC-CCITT encoder 140, a data sequence order reversing portion 130, a CRC-16 encoder 120 and a data sequence order reversing portion 110.

Received data is input to the CRC-CCITT encoder 140 in a sequential order from the leading end of the data (MSB), i.e., data MSB first. When all data in the CRC-CCITT encoder 140 are zero, judgment is made that no error is contained.

From the output of the CRC-CCITT encoder 140, data with the final sixteen bits eliminated as the CRC-CCITT code, is input to the data sequence order reversing portion 130 which is designed for outputting the input data in a sequential order from the trailing end of the input data. Upon reaching the final sixteen bits as the CRC-16 code, the output of the data sequence order reversing portion 130 is input to the CRC-16 encoder 120. Also, the final sixteen bits as the CRC-16 code is input to the CRC-16 encoder 120 in a sequential order without passing the data inverting portion 130 and thus maintains the sequential order as output from the CRC-CCITT encoder 140.

When all data in the CRC-16 encoder 120 are zero, judgment can be made that error is not contained. Then, data with the final sixteen bits eliminated as the CRC-16 code, is input to the data sequence order reversing portion 110 which outputs the input data from the trailing end, and is output as reception data.

Next, discussion will be given for the first embodiment of the CRC coding method according to the present invention. In the first embodiment of the present invention, the CRC-16 encoder, to which data is input in a sequential order from the LSB, and the CRC-CCITT encoder, to which data is input in a sequential order from the MSB are included.

Respective bits to be transmitted are taken in sequential order from the MSB to be a191, a190, a189, . . . a2, a1, a0.

Respective bits derived by calculation are taken in sequential order from the MSB to be B191, B190, B189, . . . B2, B1, B0.

Respective bits of the CRC-16 thus derived are taken in sequential order from the MSB to be C15, C14, C13, . . . C2, C1, C0.

The CRC-16 code can be derived through the following equation (8).

$$X^{16} \cdot P^*(X) = Q^*(X) \cdot G(X) + R^*(X) \tag{8}$$

$$P'^*(X) = a_0 X^{191} + a_1 X^{190} \cdots + a_{190} X + a_{191}$$

$$Q^*(X) = B_{191} X^{191} + B_{189} X^{190} \cdots + B_1 X + B_0$$

$$R^*(X) = C_{15} X^{15} + C_{14} X^{14} \cdots + C_1 X + C_0$$

$$G(X) = X^{16} + X^{15} + X^2 + 1$$

where, P*(X) is a polynominal expression derived from data to be transmitted, Q* (X) is a polynominal expression of a solution, R* (X) is a polynominal expression of CRC-16, and G* (X) is a CRC-16 generating polynominal expression.

By deriving B191 to B0 from the foregoing equation (8) in sequential order, C15 to C0 can be derived as expressed by the following equation (9). It should be noted that calculation of a191 to a0, B191 to B0 and C15 to C0 are all mod2 (0+0=1+1=0, 0 +1=0−1=1).

$$B_{191} = a_0 \tag{9}$$

$$B_{190} = a_1 + B_{191}$$

$$B_{189} = a_2 + B_{190}$$

$$B_{188} = a_3 + B_{189}$$

$$\vdots$$

$$B_2 = a_{189} + B_3 + B_{16} + B_{18}$$

$$B_1 = a_{189} + B_2 + B_{15} + B_{17}$$

$$B_0 = a_{191} + B_1 + B_{14} + B_{16}$$

$$C_{15} = B_0 + B_{13} + B_{15}$$

$$C_{14} = B_{12} + B_{14}$$

$$C_{13} = B_{11} + B_{13}$$

$$\vdots$$

$$C_2 = B_0 + B_2$$

$$C_1 = B_1$$

$$C_0 = B_0$$

Accordingly, respective bits to be transmitted are expressed on the basis of the MSB by the following equation (10).

$$a_{191}, a_{190}, a_{189}, \ldots, a_2, a_1, a_0, C_{15}, C_{14}, C_{13}, \ldots, C_2, C_0 \tag{10}$$

where C15 to C0 are result of the foregoing calculation.

Subsequently, discussion will be given as to what will happen in the calculation and how the error can be detected in the first embodiment of the CRC-16 code generating method according to the present invention, when drop out of the first one bit is nominally caused in the reception data.

When the first one bit is caused to drop out in the data transmitted through CRC-16 code calculation according to the present invention, a191 drops out from the reception data on the reception side. Thus, the reception data is expressed by the following equation (11) on the basis of the MSB.

$$a_{190}, a_{189}, a_{188}, \ldots, a_1, a_0, C_{15}, C_{14}, C_{13}, C_{12}, E_{15} \tag{11}$$

where E15 is the MSB of CRC-CCITT.

Then, the foregoing equation (11) is used as an equation for deriving the CRC-16 code in the first embodiment of the present invention. It is assumed that the respective bits of the solution derived through calculation are B'191, B'190, B'189, . . . , B'2, B'1, B'0 in a sequential order from the MSB, i.e., data MSB first, and respective bits of the CRC-16 code derived are C'15, C'14, C'13, . . . , C'2, C'1, C'0 in a sequential order from the MSB. Then, the following equation (12) is established.

$$R'(X) = X^{16} \cdot P'(X) - Q'(X) \cdot (X) \tag{12}$$

$$P'(X) = c_{15} X^{191} + a_0 X^{190} \cdots + a_{189} X + a_{190}$$

$$Q'(X) = B'_{191} X^{191} + B'_{190} X^{190} \cdots + B'_1 X + B_0$$

$$R'(X) = C_{15} X^{15} + C'_{14} X^{14} \cdots + C'_1 X + C'_0$$

$$G(X) = X^{16} + X^{15} + X^2 + 1$$

where, P' (X) is a polynominal expression derived from data to be transmitted, Q' (X) is a polynominal expression of a solution, R' (X) is a polynominal expression of CRC-16, and G' (X) is a CRC-16 generating polynominal expression.

When the following expression (13) is satisfied, the recognition is made on the reception side that data is correct.

$$C'_{15}=C_{14}, C'_{14}=C_{13}C_{13}=C_{12}, \ldots, C'_2=C_1, C'_1=C_0, C'_0=E_{15} \quad (13)$$

When calculation is performed with adding the result of the conventional CRC-16 calculation method considering that C15=0, a result as expressed by the following equation (14) can be obtained. Here, it should be noted that the reason why it is assumed that C15=0, is that the condition that C15=0 is an essential condition because there are distinct cases where C15 is added to respective bits of the solutions and respective bits of the CRC-16 code, and where C15 is not added to respective bits.

$$B'_{191} = C_{15} = 0 \quad (14)$$

$$B'_{190} = a_0 + B'_{191} = (B_{191}) + 0 = B_{191}$$

$$B'_{189} = a_0 + B'_{190} = (B_{190} + B_{191}) + B_{191} = B_{190}$$

$$B'_{188} = a_2 + B'_{189} = (B_{189} + B_{190}) + B_{190} = B_{189}$$

$$\vdots$$

$$B'_2 = a_{188} + B'_3 + B'_{16} + B'_{18} = (B_3 + B_4 + B_{17} + B_{19}) + B_4 + B_{17} + B_{19} = B_3$$

$$B'_1 = a_{189} + B'_2 + B'_{15} + B'_{17} = (B_2 + B_3 + B_{16} + B_{18}) + B_3 + B_{16} + B_{18} = B_2$$

$$B'_0 = c_{190} + B'_1 + B'_{14} + B'_{16} = (B_1 + B_2 + B_{15} + B_{17}) + B_0 + B_{15} + B_{17} = B_1$$

$$C_{15} = B'_0 + B'_{13} + B'_{15} = B_1 + B_{14} + B_{16} = a_{191} + B_0$$

$$C'_{14} = B'_{12} + B'_{14} = B_{13} + B_{15} = C_{15} + B_0$$

$$C'_{13} = B'_{11} + B'_{13} = B_{12} + B_{14} = C_{14}$$

$$\vdots$$

$$C'_2 = B'_0 + B'_2 = B_1 + B_3 = C_3$$

$$C'_1 = B'_1 = B_2 = C_2 + B_0$$

$$C'_0 = B'_0 = B_1 = C_1$$

Namely, a condition expressed by the following expression (15) is not satisfied.

$$C'_{15}=C_{14}, C'_{14}=C_{13}C_{13}=C_{12}, \ldots, C'_2=C_1, C'_1=C_0, C'_0=E_{15} \quad (15)$$

On the other hand, because conditions are differentiated respectively, even when the first one bit of the reception data is caused to drop out on the reception side, the probability of recognizing that error is contained, can be increased.

As set forth above, by varying the sequential order of the information input between CRC-16 and CRC-CCITT, the encoder for CRC-CCITT can be identical to that of the conventional system, and the error which could be detected by the CRC-CCITT can be detected as in the prior art. On the other hand, when an error is caused due to a nominal bit shift in data on the reception side and judgment occurs that error is not contained, in the CRC-CCITT, the error can certainly be detected by the first embodiment of the method according to the present invention.

Figure 3:
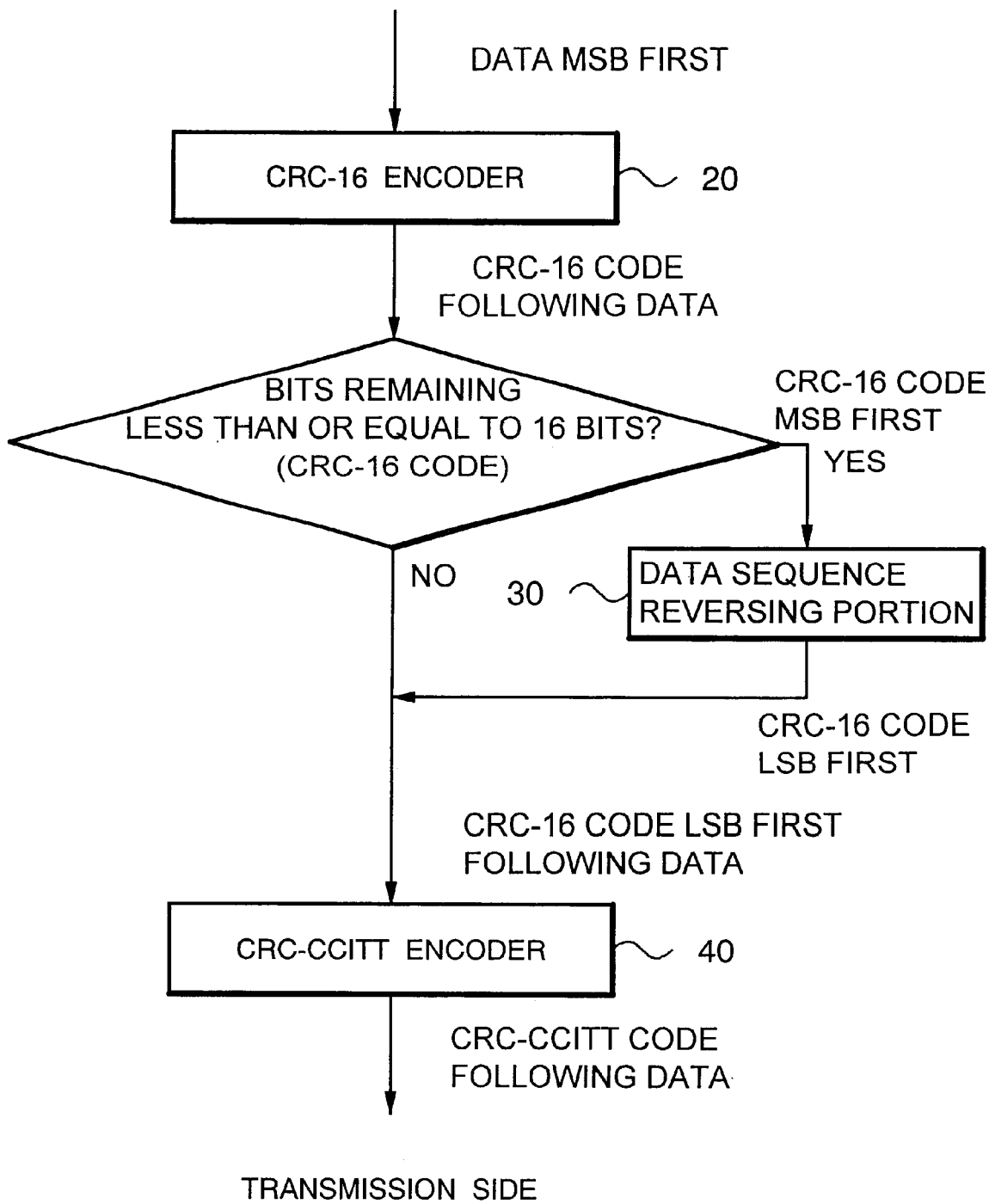
FIG. 3 is an illustration showing a construction on a transmission side in the second embodiment of a CRC coding system according to the present invention.
Figure 4:
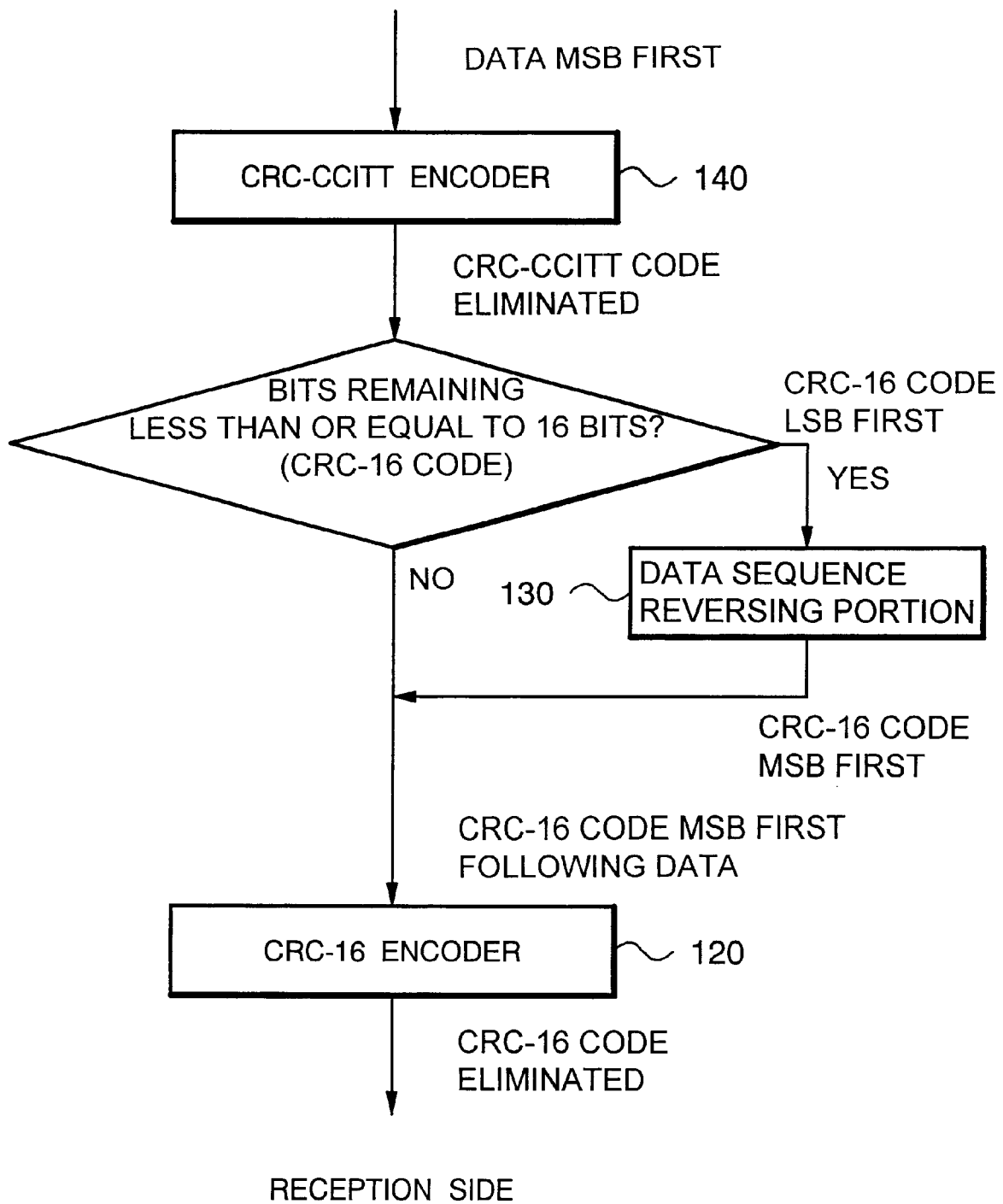
FIG. 4 is an illustration showing a construction on a reception side in the second embodiment of the CRC coding system according to the present invention.

Next, the second embodiment of the CRC coding system according to the present invention will be discussed in detail. FIG. 3 shows a construction on a transmission side of the second embodiment of the CRC coding system, and FIG. 4 shows a construction on a reception side. Here, respective components on the transmission side and the reception side are common. Therefore, by switching by means of an appropriate changeover switch, it becomes possible that a single construction may be selectively used on the transmission side and the reception side.

Referring to FIG. 3, on the transmission side, the transmission data is input to the CRC-16 encoder 20 in a sequential order from the MSB, i.e., data MSB first.

The CRC-16 encoder 20 derives a CRC-16 code from the transmission data to output the CRC-16 code following the transmission data in the sequential order.

The transmission data is input to the CRC-CCITT encoder 40 in a sequential order as output from the CRC-16 encoder 20. Upon reaching the final sixteen bits which is CRC-16 code, the output of the CRC-16 encoder 20 is input to the data sequence order reversing portion 30. The output of the data sequence order reversing portion 30 is input to the CRC-CCITT encoder 40.

The CRC-CCITT encoder 40 derives the CRC-CCITT code from the transmission data and the CRC-16 code and transmits the CRC-CCITT code following the transmission data and the CRC-16 code.

A reception side circuit is constructed with the CRC-CCITT encoder 140, the data sequence order reversing portion 130, and the CRC-16 encoder 120.

On the reception side, the received data is input to the CRC-CCITT encoder 140 in a sequential order from the leading end of the data (MSB), i.e., data MSB first. When all data in the CRC-CCITT encoder 140 are zero, judgment is made that no error is contained.

From the output of the CRC-CCITT encoder 140, data with the final sixteen bits eliminated as the CRC-CCITT code, is input to the CRC-16 encoder 120. Upon reaching the final sixteen bits as the CRC-16 code, the output of the CRC-CCITT encoder 140 is input to the data sequence order reversing portion 130 and then the output of the data sequence order reversing portion 130 is input to the CRC-16 encoder 120.

When all data in the CRC-16 encoder 120 are zero, judgment can be made that no error is contained. Then, data the final sixteen bit eliminated as the CRC-16 code, is output as a reception data.

Next, discussion will be given with respect to the second embodiment of the CRC coding method according to the present invention. In the second embodiment of the present invention, the CRC coding system includes the CRC-16 encoder transmitting the CRC-16 code in a sequential order from the LSB, i.e., data LSB first, and the CRC-CCITT encoder transmitting the CRC-CCITT code in a sequential order from the MSB, i.e., data MSB first.

Here, discussion will be given for calculation of the CRC-16 code in the case where drop out of the first one bit is caused in the data transmitted with sequence order reversing the CRC-16 code.

When drop out of the first one bit is caused in the data transmitted with sequence order reversing the CRC-16 code, drop output of a191 is caused in the reception data on the reception side. Then, the reception data is expressed by the following equation (16) on the basis of the MSB.

$$a_{190}, a_{189}, a_{188}, \ldots, a_1, a_0, a_0, c_0, c_1, c_2, c_3, \ldots, c_{14}, c_{15}, e_{15} \quad (16)$$

where e15 is the MSB of CRC-CCITT.

Then, the foregoing equation (16) is used as an equation for deriving the CRC-16 code in the second embodiment of the present invention. It is assumed that the respective bits of the solution derived through calculation are b*191, b*190, b*189, . . . , b*2, b*1, b*0 in a sequential order from the MSB, and respective bits of the CRC-16 code derived are C'15, c*"14, c*"13, . . . , c*"1, c*"0 in a sequential order from the MSB. Then, the following equation (17) is established.

$$R^{*\prime}(X) = X^{16} \cdot P^{*\prime}(X) \cdot Q^{*\prime}(X) + G(X) \quad (17)$$

$$P^{*\prime}(X) = a_{190}X^{191} + a_{189}X^{190} \cdots + a_0 X + c_0$$

$$Q^{*\prime} = b_{191}^{*\prime} X^{191} + b_{190}^{*\prime} X^{190} \cdots + b_1^{*\prime} X + b_0^{*\prime}$$

$$R^{*\prime}(X) = c_{15}^{*\prime} X^{15} + c_{14}^{*\prime} X^{14} \cdots + c_1^{*\prime} X + c_0^{*\prime}$$

$$G(X) = X^{16} + X^{15} + X^2 + 1$$

where, $P^{*\prime}(X)$ is a polynominal expression derived from data to be transmitted, $Q^{*\prime}(X)$ is a polynominal expression of a solution, $R^{*\prime}(X)$ is a polynominal expression of CRC-16, and $G^{*\prime}(X)$ is a CRC-16 generating polynominal expression.

When the following expression (18) is satisfied, the recognition is made on the reception side that data is correct.

$$c^{\prime\prime}_{15}=e_{15}c^{\prime\prime}_{14}=c_{15}c^{\prime\prime}_{13}=c_{14}, \ldots, c^{\prime\prime}_{2}=c_{3}c^{\prime\prime}_{1}=c_{2}c^{\prime\prime}_{0}=c_{1} \quad (18)$$

When calculation is performed with adding the result of the conventional CRC-16 calculation method considering that a191=0, a result as expressed by the following equation (19) can be obtained. Here, it should be noted that the reason why it is assumed that a191=0, is that the condition that a191=0 is essential condition because there are distinct cases where a191 is added to respective bits of the solutions and respective bits of the CRC-16 code, and where a191 is not added to respective bits.

$$b_{191}^{*\prime} = a_{190} = b_{190} + b_{191} = b_{190} + a_{191} = b_{190} \quad (19)$$

$$b_{190}^{*\prime} = a_{189} + b_{191}^{*\prime} = (b_{189} + b_{190}) + b_{190} = b_{189}$$

$$b_{189}^{*\prime} = a_{188} + b_{190}^{*\prime} = (b_{188} + b_{189}) + b_{189} = b_{188}$$

$$b_{188}^{*\prime} = a_{187} + b_{189}^{*\prime} = (b_{187} + b_{188}) + b_{188} = b_{187}$$

$$\vdots$$

$$b_2^{*\prime} = a_1 + b_3^{*\prime} + b_{16}^{*\prime} + b_{18}^{*\prime}$$
$$= (b_1 + b_2 + b_{15} + b_{17}) + b_2 + b_{15} + b_{17} = b_1$$

$$b_1^{*\prime} = a_0 + b_2^{*\prime} + b_{15}^{*\prime} + b_{17}^{*\prime}$$
$$= (b_0 + b_1 + b_{14} + b_{16}) + b_1 + b_{14} + b_{16} = b_0$$

$$b_0^{*\prime} = c_0 + b_1^{*\prime} + b_{14}^{*\prime} + b_{16}^{*\prime}$$
$$= (b_0) + b_0 + b_{13} + b_{15} = c_{15} + b_0$$

$$c_{15}^{*\prime} = b_0^{*\prime} + b_{13}^{*\prime} + b_{15}^{*\prime} = c_{15} + b_0 + b_{12} = b_{14} = c_{15} + b_0 + c_{14}$$

$$c_{14}^{*\prime} = b_{12}^{*\prime} + b_{14}^{*\prime} = b_{11} + b_{13} = c_{13}$$

$$c_{13}^{*\prime} = b_{11}^{*\prime} + b_{13}^{*\prime} = b_{10} + b_{12} = c_{12}$$

$$\vdots$$

$$c_2^{*\prime} = b_0^{*\prime} + b_2^{*\prime} = c_{15} + b_0 + b_1 = c_{15} + b_0 + c_1$$

$$c_1^{*\prime} = b_1^{*\prime} = b_0 = c_0$$

$$c_0^{*\prime} = b_0^{*\prime} = \quad = c_{15} + b_0$$

Namely, a condition expressed by the following expression (20) is not satisfied. On the other hand, because conditions are differentiated respectively, even when the first one bit of the reception data is caused to drop out on the reception side, the probability of recognizing that error is contained, can be increased.

$$c^{\prime\prime}_{15}=e_{15}c^{\prime\prime}_{14}=c_{15}c^{\prime\prime}_{13}=c_{14}, \ldots, c^{\prime\prime}_{2}=c_{3}c^{\prime\prime}_{1}=c_{2}c^{\prime\prime}_{0}=c_{1} \quad (20)$$

As set forth above, by varying the sequential order of transmission between CRC-16 and CRC-CCITT, the encoder for CRC-CCITT can be identical to that of the conventional system, and the error which could be detected by the CRC-CCITT can be detected as in the prior art. On the other hand, when an error is caused due to a bit shift in data on the reception side and a judgment occurs that error is not contained, in the CRC-CCITT, the error can certainly be detected by the first embodiment of the method according to the present invention.

Figure 5:
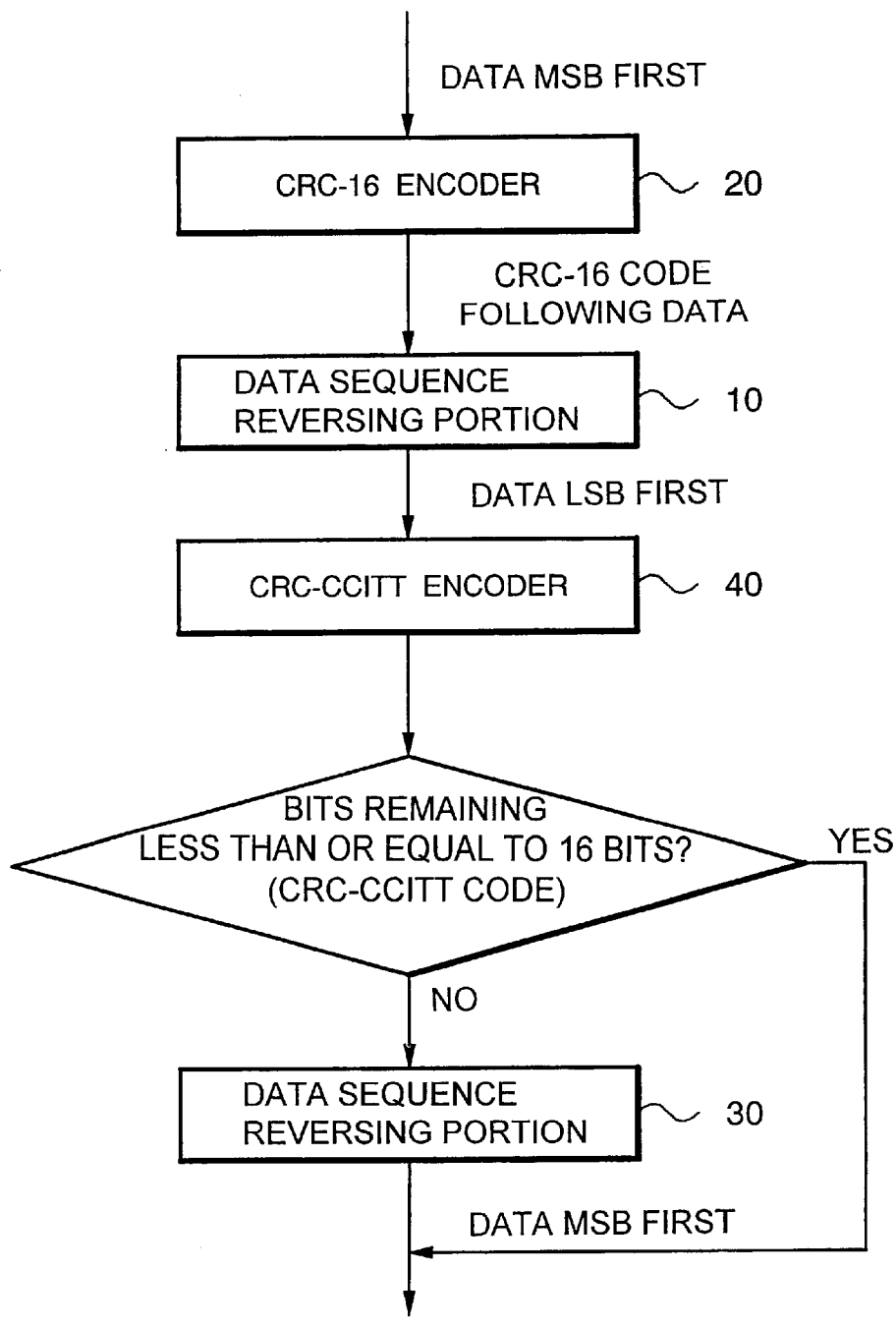
FIG. 5 is an illustration showing a construction on a transmission side in the third embodiment of a CRC coding system according to the present invention.

Next, discussion will be given with respect to the third embodiment of the CRC coding system according to the present invention. FIG. 5 shows a construction on the transmission side of the third embodiment of the CRC coding system and FIG. 6 shows a construction on the reception side.

Figure 6:
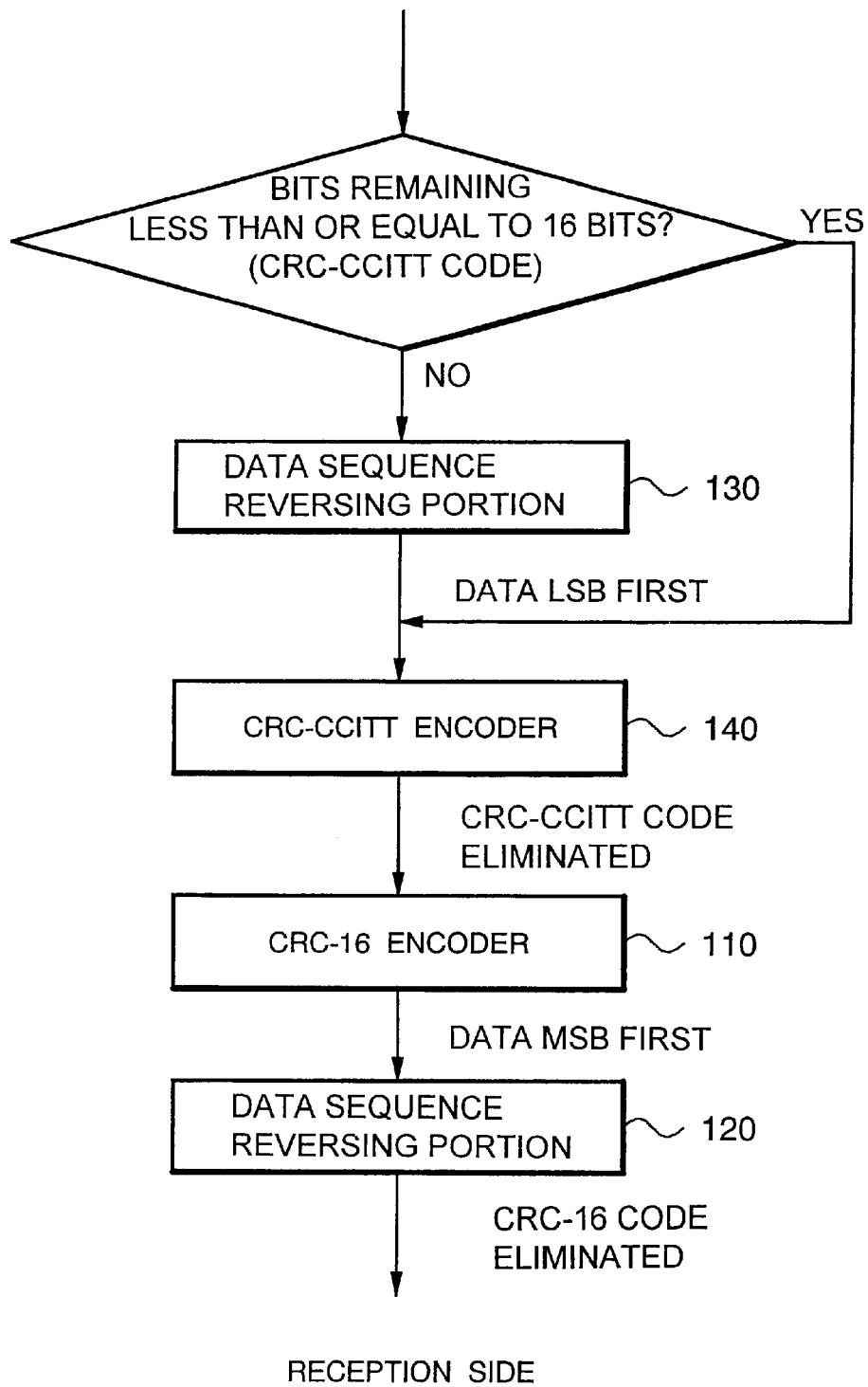
FIG. 6 is an illustration showing a construction on a reception side in the third embodiment of the CRC coding system according to the present invention.

Referring to FIGS. 5 and 6, the third embodiment of the CRC coding system is constructed by modifing positions of the data sequence order reversing portions 10, 30, 110 and 130 for inverting data, in the first embodiment of FIGS. 1 and 2.

Namely, referring to FIG. 5, on the transmission side, the CRC-16 encoder 20 derives the CRC-16 code from the transmission data in a sequential order from the MSB, i.e., data MSB first, and outputs the CRC-code following to the transmission data in a sequential order from the MSB.

The transmission data output from the CRC-16 encoder is sequence order reversed by the data sequence order reversing portion 10 so as to output in a sequential order from the trailing end of the transmission data, and is then input to the CRC-CCITT encoder 40.

The CRC-CCITT encoder 40 derives the CRC-CCITT code from the transmission data and the CRC-16 code. Then, the CRC-CCITT encoder 40 transmits the CRC-CCITT code following the transmission data in a sequential order from the LSB, i.e., data LSB first.

The transmission data is input in a sequential order from the LSB to the data sequence order reversing portion 30. Upon reaching the final sixteen bits as the CRC-CCITT code, the output of the data sequence order reversing portion 30 is transmitted. Then, the final sixteen bits as the CRC-CCITT is transmitted in a sequential order as output from the CRC-CCITT encoder 40 without passing the data sequence order reversing portion 30.

Referring to FIG. 6, on the reception side, the received data is input to the data sequence order reversing portion 130. Upon reaching the final sixteen bits as the CRC-CCITT code, the output of the data sequence order reversing portion 130 is transmitted. The final sixteen bits as the CRC-CCITT code is input to the CRC-CCITT encoder 140 without passing the data sequence order reversing portion 130. When all data in the CRC-CCITT encoder 140 are zero, judgment is made that no error is contained.

Data with the final sixteen bits of the CRC-CCITT code eliminated from the output of the CRC-CCITT encoder 140 is input to the data sequence order reversing portion 110 which is designed to output the input data in a sequential order from the trailing end. Then, the output of the data sequence order reversing portion 110 is input to the CRC-16 encoder 120. When all data in the CRC-16 encoder 120 are zero, judgment is made that no error is contained. Data with the final sixteen bits eliminated as the CRC-16 code is then output as the reception data.

Next, discussion will be given with respect to the third embodiment of the CRC coding method according to the present invention. In the third embodiment of the present invention, as set forth above, the CRC coding system includes the CRC-16 encoder inputting data in a sequential order from the MSB and the CRC-CCITT encoder inputting data in a sequential order from the LSB, i.e., data LSB first.

The third embodiment of the CRC coding method according to the present invention can be explained by replacing the CRC-16 generating polynominal expression with the polynominal expression of CRC-CCITT in error detection in the CRC-16 code calculation in the first embodiment of the CRC coding method and in the first embodiment of the method according to the present invention. In the third embodiment of the present invention, the same result as that obtained in the first embodiment can be obtained.

Figure 7:
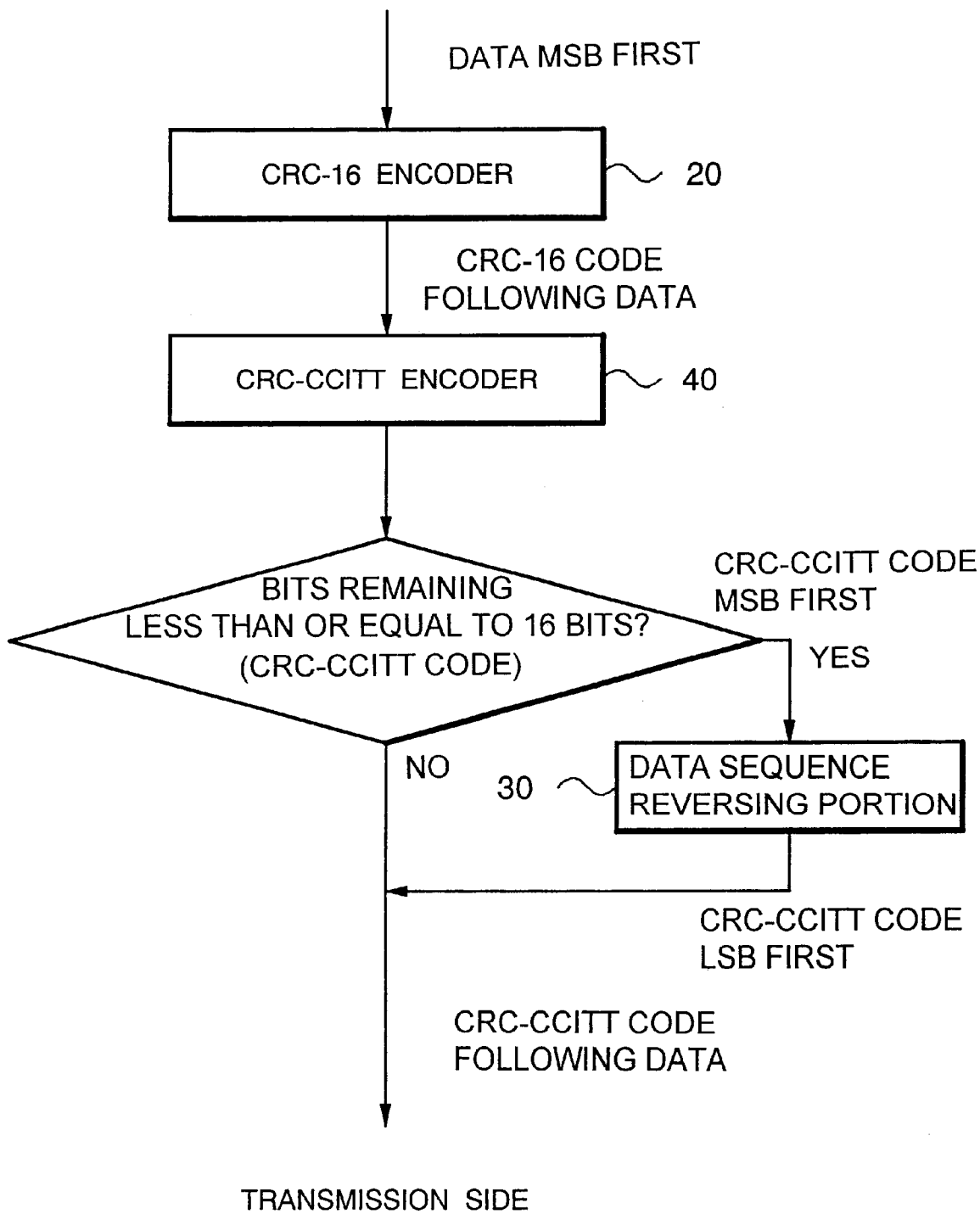
FIG. 7 is an illustration showing a construction on a transmission side in the fourth embodiment of a CRC coding system according to the present invention.

Next, the fourth embodiment of the CRC coding system according to the present invention will be discussed. FIG. 7 shows a construction on the transmission side of the fourth embodiment of the CRC coding system and FIG. 8 shows a construction on the reception side thereof.

Figure 8:
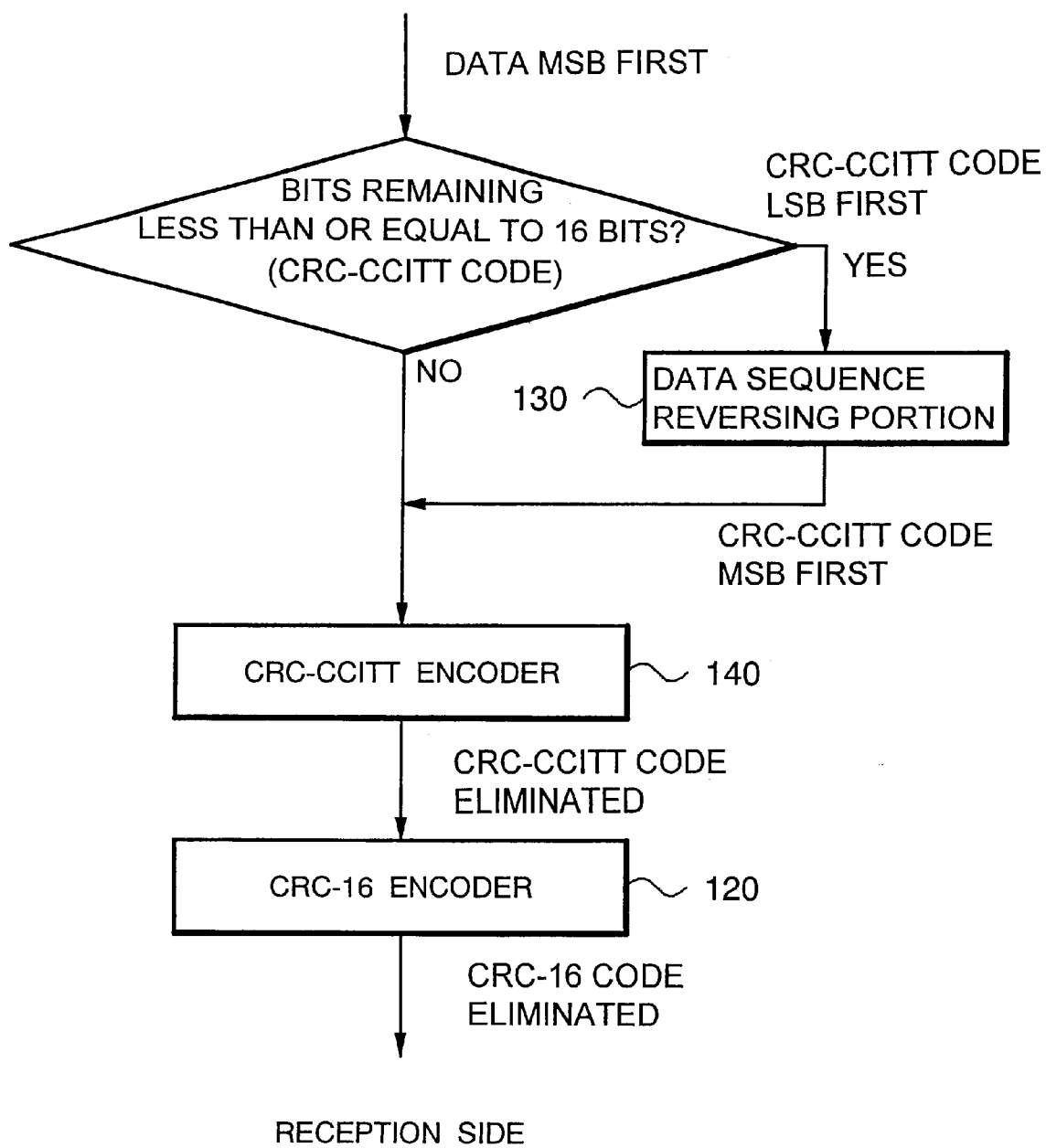
FIG. 8 is an illustration showing a construction on a reception side in the fourth embodiment of the CRC coding system according to the present invention.
Figure 9:
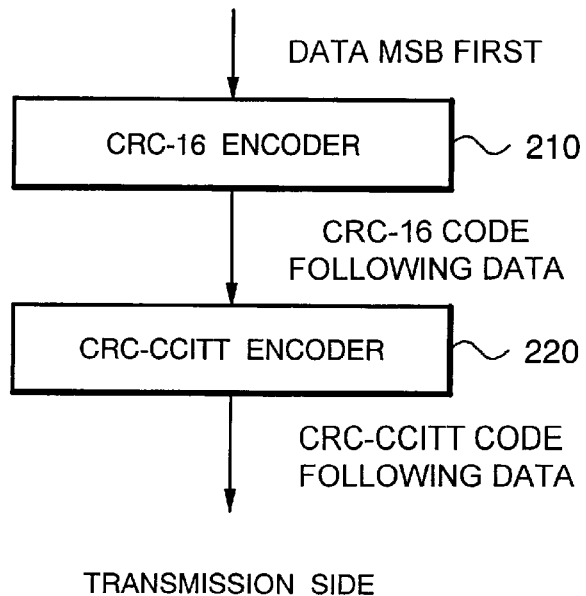
FIG. 9 is an illustration showing a construction on a transmission side in the conventional CRC coding system.
Figure 10:
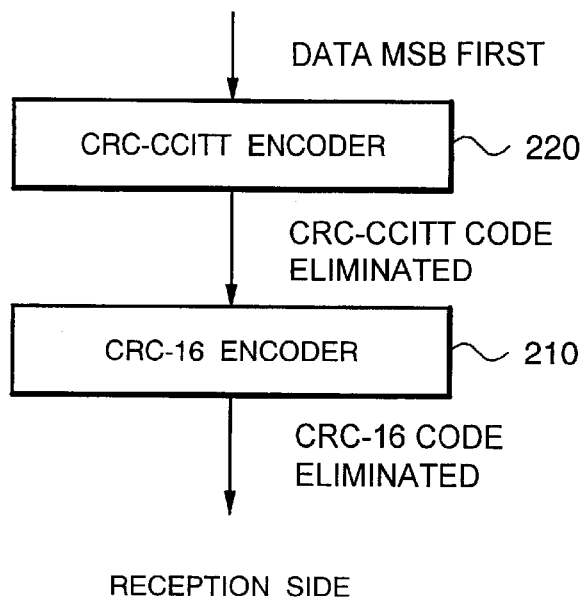
FIG. 10 is an illustration showing a construction on a reception side in the conventional CRC coding system.

Referring to FIGS. 7 and 8, the fourth embodiment is constructed by modifying positions of the data sequence order reversing portions 30 and 130 sequence order reversing data in the second embodiment shown in FIGS. 3 and 4.

Namely, referring to FIG. 7, on the transmission side, the transmission data is input to the CRC-16 encoder 20 in a sequential order from the MSB, i.e., data MSB first.

The CRC-16 encoder 20 derives the CRC-16 code from the transmission data for outputting the CRC-16 code following the transmission data. The transmission data and the CRC-16 code are input to the CRC-CCITT encoder 40 while maintaining a sequential order as output from the CRC-16 encoder 20.

The CRC-CCITT encoder 40 derives the CRC-CCITT code from the transmission data and the CRC-16 code to transmit the CRC-CCITT code following the transmission data and the CRC-16 code. The transmission data and the CRC-16 code are transmitted in sequential order as output from the CRC-16 encoder 20. When the final sixteen bits as the CRC-CCITT code is reached, the CRC-CCITT code is input to the data sequence order reversing portion 30 to transmit the CRC-CCITT code following the transmission data and the CRC-16 code.

Referring to FIG. 8, on the reception side, the received data is input to the CRC-CCITT encoder 140 in a sequential order from the MSB, i.e., data MSB first. When the final sixteen bits as the CRC-CCITT code is reached, the CRC-CCITT code is input to the CRC-CCITT encoder 140 via the data sequence order reversing portion 130. When all data in the CRC-CCITT encoder 140 are zero, judgment is made that no error is contained.

Data with the final sixteen bits eliminated as the CRC-CCITT code from the output of the CRC-CCITT encoder 120 is input to the CRC-16 encoder 120. When the final sixteen bits of the CRC-16 code is reached, data is input to the data sequence order reversing portion 130 to input the output of the data sequence order reversing portion 130 to the CRC-16 encoder 120.

When all data in the CRC-16 encoder 120 are zero, judgment is made that no error is contained. Then, data with the final sixteen bits eliminated as the CRC-16 code is output as the reception data.

Next, discussion will be given for the fourth embodiment of the CRC coding method according to the present invention. The fourth embodiment of the CRC coding system according to the present invention includes the CRC-16 encoder transmitting the CRC-16 code in a sequential order from the MSB and the CRC-CCITT encoder transmitting the CRC-CCITT code in a sequential code from the LSB.

It should be noted that the shown embodiments of the CRC coding system can be realized by hardware or by software. The CRC coding system realized by the software can be realized by executing respective functions of a CRC coding processing program having respective of CRC-16 encoder, CRC-CCITT encoder and data sequence order reversing portions by loading in a memory of a computer processing system. The CRC coding processing program may be stored on a magnetic disk, a semiconductor memory or other storage medium. Then, the CRC coding process program is loaded into the computer processing system from the storage medium to control operation of the computer processing system to execute the CRC coding process by realizing respective functions.

As set forth above, according to the present invention, even when bit shift is caused in the reception data, error detection performance remains high. The reason is that, by reversing the order of information input to both encoder of the CRC-16 and the CRC-CCITT, error can be detected with a high probability even if bit shift is caused.

The CRC coding system and the CRC coding method in respective embodiments set forth above are applicable for the CRC coding of the high speed data transmission system in a digital car telephone system, for example.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

We claim:

1. A CRC coding method for performing coding by a CRC-16 encoder and a CRC-CCITT encoder, comprising:

inputting data to one of said CRC-16 encoder and said CRC-CCITT encoder in a sequential order from a least significant bit to a most significant bit, inputting data to the other of said CRC-16 encoder and said CRC-CCITT encoder in sequential order from a most significant bit; and inputting a code generated by the one of said CRC-16 encoder and said CRC-CCITT encoder to the other of said CRC-16 encoder and said CRC-CCITT encoder.

2. A CRC coding method as set forth in claim 1, wherein on a transmission side of data, the transmission comprises:

sequence order reversing data input in a sequential order from the most significant bit to input data in a sequential order from the least significant bit to said CRC-16 encoder, sequence order reversing data from said CRC-16 encoder to input data in a sequential order from the most significant bit to said CRC-CCITT encoder, inputting a CRC-16 code generated by said CRC-16 encoder to said CRC-CCITT encoder without sequence order reversing, and outputting a CRC-CCITT code generated by said CRC-CCITT encoder to follow said data and said CRC-16 code, and wherein on a reception side of data, the reception comprises:

inputting received data to said CRC-CCITT encoder in a sequential order from the most significant bit, sequence order reversing data, from which a CRC-CCITT code has been eliminated, from said CRC-CCITT encoder and inputting said sequence order reversed data from said CRC-CCITT encoder to said CRC-16 encoder, inputting said CRC-16 code to said CRC-16 encoder without sequence order reversing, and outputting data from which said CRC-16 data has been eliminated from said CRC-16 encoder as reception data.

3. A CRC coding method as set forth in claim 1, wherein on a transmission side of data, the transmission comprises:

inputting data input in a sequential order from the most significant bit, to said CRC-16 encoder, sequence order reversing data and CRC-16 code generated from said CRC-16 encoder and inputting said sequence order reversed CRC-16 code and data to said CRC-CCITT encoder in a sequential order from the least significant bit, and outputting said data and said CRC-16 code from said CRC-CCITT sequence order reversed and outputting a CRC-CCITT code generated from said CRC-CCITT encoder following said data and said CRC-16 code without sequence order reversing, and wherein on a reception side of data, the reception comprises:

inputting received data to said CRC-CCITT encoder sequence order reversed and inputting said CRC-CCITT code to said CRC-CCITT encoder without sequence order reversing, inputting data from which the CRC-CCITT code has been eliminated from said CRC-CCITT encoder to said CRC-16 encoder and sequence order reversing data and CRC-16 code output from said CRC-16 encoder in a sequential order from the most significant bit, and outputting data from which the CRC-16 code has been eliminated from said CRC-16 encoder as reception data.

4. A CRC coding method as set forth in claim 1, where the method is applied to CRC coding of a high speed data transmission system of a digital car telephone system.

5. A CRC coding method for performing coding by a CRC-16 encoder and a CRC-CCITT encoder, comprising:

inputting data to one of said CRC-16 encoder and said CRC-CCITT encoder in sequential order from a most significant bit, and generating and adding a CRC code by one of said CRC-16 encoder and said CRC-CCITT encoder in a sequential order from the least significant bit to the most significant bit.

6. A CRC coding method as set forth in claim 5, wherein on a transmission side of data, the transmission comprises:

inputting data in a sequential order from the most significant bit to said CRC-16 encoder, sequence order reversing CRC-16 code generated by said CRC-16 encoder and following data from said CRC-16 encoder and inputting said sequence order reversed CRC-16 code and data to said CRC-CCITT encoder, generating a CRC-CCITT code by said CRC-CCITT encoder and transmitting said CRC-CCITT code following said data and said CRC-16 code, and wherein on a reception side of data, the reception comprises:

inputting data received in a sequential order from the most significant bit to said CRC-CCITT encoder, sequence order reversing CRC-16 code following data output from said CRC-CCITT encoder and inputting said sequence order reversed CRC-16 code and said data output from said CRC-CCITT encoder to said CRC-16 encoder, and outputting data from said CRC-16 encoder, from which said CRC-16 code is eliminated, as reception data.

7. A CRC coding method as set forth in claim 5, wherein on a transmission side of data, the transmission comprises:

inputting data input in a sequential order from the most significant bit to said CRC-16 encoder, inputting data from said CRC-16 encoder and a CRC-16 code generated by said CRC-16 encoder to said CRC-CCITT encoder as is, sequence order reversing a CRC-CCITT code generated by said CRC-CCITT encoder following said data and said CRC-16 code, and wherein on a reception side of data, the reception comprises:

inputting received data to said CRC-CCITT encoder in a sequential order from the most significant bit and sequence order reversing said CRC-CCITT code, inputting data from which said CRC-CCITT code has been eliminated from said CRC-CCITT encoder and said CRC-16 code to said CRC-16 encoder, and outputting data from which said CRC-16 code has been eliminated from said CRC-16 encoder as reception data.

8. A CRC-coding method as set forth in claim 5, where the method is applied to CRC coding for a high speed data transmission of a digital car telephone system.

9. A CRC coding system performing CRC coding comprising:

a CRC-16 encoder;

a CRC-CCITT encoder;

a sequence order reversing portion that inputs data to one of said CRC-16 encoder and said CRC-CCITT encoder in a sequential order from the least significant bit to the most significant bit;

another sequence order reversing portion that inputs data to the other of said CRC-16 encoder and said CRC-CCITT encoder in a sequential order from the most significant bit; and wherein code generated by the one of said CRC-16 encoder and said CRC-CCITT encoder is input to the other of said CRC-16 encoder and said CRC-CCITT encoder.

10. A CRC coding system as set forth in claim 9, comprising:

a transmission side circuit comprising:

a first sequence order reversing portion that sequence order reverses data input in a sequential order from the most significant bit and inputs said sequence order reversed data to said CRC-16 encoder in a sequential order from the least significant bit; and a second sequence order reversing portion that sequence order reverses data from said CRC-16 encoder and inputs said sequence order reversed data from said CRC-16 encoder to said CRC-CCITT encoder in a sequential order from the most significant bit, and a reception side circuit comprising:

a third sequence order reversing portion that sequence order reverses data from said CRC- CCITT encoder, and inputs to said CRC-16 encoder in a sequential order from the least significant bit; and fourth sequence order reversing portion that sequence order reverses data, from which CRC-16 code is eliminated, from said CRC-16 encoder.

11. A CRC coding system as set forth in claim 9, comprising:

a transmission side circuit comprising:
first sequence order reversing portion that sequence order reverses data and a CRC-16 code from said CRC-16 encoder, and inputs said sequence order reversed data to said CRC-CCITT encoder in a sequential order from the least significant bit; and
second sequence order reversing portion that sequence order reverses said data and said CRC-16 code other than a CRC-CCITT code generated by said CRC-CCITT encoder, and a reception side circuit comprising:
third sequence order reversing portion that sequence order reverses received data other than said CRC-CCITT code; and
fourth sequence order reversing portion that sequence order reverses data, from which CRC-CCITT code is eliminated, and said CRC-16 code from said CRC-CCITT encoder and inputs to said CRC-16 encoder in a sequential order from the most significant bit.

12. A CRC coding system for CRC coding comprising:
a CRC-16 encoder;
a CRC-CCITT encoder;
a sequence order reversing portion that adds a CRC code generated by one of said CRC-16 encoder and said CRC-CCITT encoder in a sequential order from the least significant bit to the most significant bit; and
another sequence order reversing portion that inputs data to one of said CRC-16 encoder and said CRC-CCITT encoder in a sequential order from the most significant bit; and
wherein code generated by the one of said CRC-16 encoder and said CRC-CCITT encoder is input to the other of said CRC-16 encoder and said CRC-CCITT encoder.

13. A CRC coding system as set forth in claim 12, comprising:

a transmission side circuit comprising:
first sequence order reversing portion that sequence order reverses a CRC-16 code generated by said CRC-16 encoder following data and inputs to said CRC-CCITT encoder, a reception side circuit comprising:
second sequence order reversing portion that sequence order reverses said CRC-16 code following data, from which the CRC-CCITT code is eliminated, from said CRC-CCITT encoder, and inputs to said CRC-16 encoder.

14. A CRC coding system as set forth in claim 12, comprising:

a transmission side circuit comprising:
first sequence order reversing portion that sequence order reverses the CRC-CCITT code generated by said CRC-CCITT encoder, following said data and a CRC-16 code for outputting, and a reception side circuit comprising:
second sequence order reversing portion that sequence order reverses said CRC-CCITT code and inputs to said CRC-CCITT encoder.

15. A computer readable memory storing a CRC coding program performing coding by a CRC-16 encoder and a CRC-CCITT encoder, wherein said CRC coding program performs a coding process, said coding process comprising:
inputting data to one of said CRC-16 encoder and said CRC-CCITT encoder in a sequential order from the least significant bit to the most significant bit, and
inputting data to the other of said CRC-16 encoder and said CRC-CCITT encoder in sequential order from a most significant bit.

16. A computer readable memory storing the CRC-coding program as set forth in claim 15, wherein in said coding process, on a transmission side of data, the transmission comprises:
sequence order reversing data input in a sequential order from the most significant bit to input data in a sequential order from the least significant bit to said CRC-16 encoder,
sequence order reversing data from said CRC-16 encoder to input data in a sequential order from the most significant bit to said CRC-CCITT encoder,
inputting a CRC-16 code generated by said CRC-16 encoder to said CRC-CCITT encoder without sequence order reversing, and
outputting a CRC-CCITT code generated by said CRC-CCITT encoder to follow said data and said CRC-16 code, and wherein on a reception side of data, the reception comprises:
inputting received data to said CRC-CCITT encoder in a sequential order from the most significant bit,
sequence order reversing data from which a CRC-CCITT code has been eliminated from said CRC-CCITT encoder and inputting said sequence order reversed data from said CRC-CCITT encoder to said CRC-16 encoder,
inputting said CRC-16 code to said CRC-16 encoder without sequence order reversing, and
outputting data from which said CRC-16 data has been eliminated from said CRC-16 encoder as reception data.

17. A computer readable memory storing the CRC-coding program as set forth in claim 15, wherein in said coding process, on a transmission side of data, the transmission comprises:
inputting data input in a sequential order from the most significant bit, to said CRC-16 encoder,
sequence order reversing data and CRC-16 code generated from said CRC-16 encoder and inputting said sequence order reversed CRC-16 code and data to said CRC-CITT encoder in a sequential order from the least significant bit, and
outputting said data and said CRC-16 code from said CRC-CCITT encoder sequence order reversed and outputting a CRC-CCITT code generated from said CRC-CCITT encoder following said data and said CRC-16 code without sequence order reversing, and wherein on a reception side of data, the reception comprises:
inputting received data to said CRC-CCITT encoder sequence order reversed and inputting said CRC-CCITT code to said CRC-CCITT encoder without sequence order reversing,
inputting data from which the CRC-CCITT code has been eliminated from said CRC-CCITT encoder to said CRC-16 encoder and sequence order reversing data and CRC-16 code output from said CRC-16 encoder in a sequential order from the most significant bit, and outputting data from which the CRC-16 code has been eliminated from said CRC-16 encoder as reception data.

18. A computer readable memory storing a CRC coding program performing coding by a CRC-16 encoder and a CRC-CCITT encoder, wherein said CRC coding program performs a coding process, said coding process comprising:

inputting data to one of said CRC-16 encoder and said CRC-CCITT encoder in sequential order from a most significant bit, and adding CRC code generated by one of said CRC-16 encoder and said CRC-CCITT encoder in a sequential order from the least significant bit to the most significant bit.

19. A computer readable memory storing the CRC-coding program as set forth in claim 15, wherein in said coding process, on a transmission side of data, the transmission comprises:

inputting data in a sequential order from the most significant bit to said CRC-16 encoder, sequence order reversing CRC-16 code generated by said CRC-16 encoder and following data from said CRC-16 encoder and inputting said sequence order reversed CRC-16 code and data to said CRC-CCITT encoder, generating a CRC-CCITT code by said CRC-CCITT encoder and transmitting said CRC-CCITT code following said data and said CRC-16 code, and wherein on a reception side of data, the reception comprises:

inputting data received in a sequential order from the most significant bit to said CRC-CCITT encoder, sequence order reversing CRC-16 code following data output from said CRC-CCITT encoder and inputting said sequence order reversed CRC-16 code and said data output from said CRC-CCITT encoder to said CRC-16 encoder, and outputting data from said CRC-16 encoder, from which said CRC-16 code is eliminated, as reception data.

20. A computer readable memory storing the CRC-coding program as set forth in claim 15, wherein in said coding process, on a transmission side of data, the transmission comprises:

inputting data input in a sequential order from the most significant bit to said CRC-16 encoder, inputting data from said CRC-16 encoder and a CRC-16 code generated by said CRC-16 encoder to said CRC-CCITT encoder as is, sequence order reversing a CRC-CCITT code generated by said CRC-CCITT encoder following said data and said CRC-16 code, and wherein on a reception side of data, the reception comprises:

inputting received data to said CRC-CCITT encoder in a sequential order from the most significant bit and sequence order reversing said CRC-CCITT code, inputting data from which said CRC-CCITT code has been eliminated from said CRC-CCITT encoder and said CRC-16 code to said CRC-16 encoder, and outputting data from which said CRC-16 code has been eliminated from said CRC-16 encoder as reception data.

* * * * *